United States Patent
Nishimura

(10) Patent No.: US 8,247,783 B2
(45) Date of Patent: Aug. 21, 2012

(54) METHOD OF DETERMINING MAIN DEFLECTION SETTLING TIME FOR CHARGED PARTICLE BEAM WRITING, METHOD OF WRITING WITH CHARGED PARTICLE BEAM, AND APPARATUS FOR WRITING WITH CHARGED PARTICLE BEAM

(75) Inventor: Reiko Nishimura, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 168 days.

(21) Appl. No.: 12/771,108

(22) Filed: Apr. 30, 2010

(65) Prior Publication Data

US 2010/0288939 A1 Nov. 18, 2010

(30) Foreign Application Priority Data

May 15, 2009 (JP) ................................ 2009-118467

(51) Int. Cl.
*H01J 37/10* (2006.01)
(52) U.S. Cl. ................ 250/396 R; 250/397; 250/492.22
(58) Field of Classification Search ................ 250/396 R
See application file for complete search history.

(56) References Cited

U.S. PATENT DOCUMENTS

| 5,134,300 | A * | 7/1992 | Kai et al. .................... 250/492.2 |
| 7,417,233 | B2 * | 8/2008 | Stovall et al. .............. 250/396 R |
| 7,705,322 | B2 * | 4/2010 | Nishimura et al. ........ 250/396 R |
| 2008/0067338 | A1 | 3/2008 | Nishimura et al. |
| 2009/0084990 | A1 * | 4/2009 | Nishimura et al. ....... 250/492.22 |

FOREIGN PATENT DOCUMENTS

JP 2008-71986 3/2008

* cited by examiner

*Primary Examiner* — Phillip A Johnston
(74) *Attorney, Agent, or Firm* — Oblon, Spivak, McClelland, Maier & Neustadt, L.L.P.

(57) ABSTRACT

An electron beam is moved a long distance along a straight line from a sub-deflection region 101*a* to a diagonally opposite sub-deflection region 123*w* by main deflection of the beam, and a pattern P is written in the sub-deflection region 123*w*. The former writing step is repeated a plurality of times each with a different main deflection settling time, thereby writing a plurality of patterns P. The amount of displacement of each pattern P from its designed position is then measured. Further, the latter writing step is also repeated a plurality of times each with a different main deflection settling time, thereby writing another plurality of patterns P. The amount of displacement of each pattern P from its designed position is then measured.

8 Claims, 7 Drawing Sheets

METHOD OF DETERMINING MAIN DEFLECTION SETTLING TIME FOR CHARGED PARTICLE BEAM WRITING, METHOD OF WRITING WITH CHARGED PARTICLE BEAM, AND APPARATUS FOR WRITING WITH CHARGED PARTICLE BEAM

BACKGROUND OF THE INVENTION

1. Field of the Invention

The present invention relates to a method of determining a main deflection settling time for charged particle beam writing, a method of writing with a charged particle beam, and an apparatus for writing with a charged particle beam.

2. Background Art

Along with the development of higher levels of integration in semiconductor devices, the dimensions of their circuit patterns have decreased. Formation of a fine circuit pattern in a semiconductor device requires a highly accurate original artwork pattern (i.e., reticle or mask). Electron beam writing apparatuses, which provide a superior resolution, are used to manufacture such original artwork patterns.

An electron beam writing apparatus of this type is known in which the main deflector and sub-deflector are disposed along the electron beam optical path and used to deflect the electron beam to write a pattern on a workpiece on the stage (see, e.g., Japanese Laid-Open Patent Publication No. 2008-71986). In such electron beam writing apparatus, predetermined voltages are applied to the main deflector and the sub-deflector to move the electron beam. The application of these voltages to the deflectors is not instantly fully accomplished, requiring the apparatus to wait for the settling time, which is the time required for electrical circuits such as deflection amplifiers to stabilize. The above publication discloses a method of optimizing the sub-deflection settling time.

On the other hand, traditionally electron beam writing apparatuses have been able to set a long enough main deflection settling time.

However, the size of sub-deflection regions has been decreased to improve the positional accuracy of writing, thus increasing the number of sub-deflection regions in each main deflection region and hence increasing the number of main deflection operations to be performed on the region. Therefore, an increase in the main deflection settling time may result in reduced throughput of the apparatus.

In view of the above problems, it is an object of the present invention to optimize the main deflection settling time for charged particle beam writing and thereby improve the throughput.

SUMMARY OF THE INVENTION

According to one aspect of the present invention, a method of determining a main deflection settling time for charged particle beam writing, comprises: a first writing step of writing a pattern in a sub-deflection region after moving a charged particle beam to the sub-deflection region from an adjacent sub-deflection region by main deflection of the charged particle beam; and a second writing step of writing a pattern in a sub-deflection region after moving the charged particle beam along a straight line to the sub-deflection region from a diagonally opposite sub-deflection region with respect to the center of the main deflection region by main deflection of the charged particle beam, the straight line resulting from the rotation of one of the two diagonal lines of the main deflection region around the center of the main deflection region. Each of the first and second writing steps includes writing a plurality of the patterns each with a different main deflection settling time. The method further comprises: measuring the position of each of the pluralities of patterns written by the first and second writing steps; determining the amount of displacement of each of the pluralities of patterns from its designed position; and determining, in accordance with the amount of main deflection, the main deflection settling time to be used so that the amount of displacement of each pattern written by the first writing step is within a first range and so that the amount of displacement of each pattern written by the second writing step is within a second range.

According to another aspect of the present invention, a method of writing with a charged particle beam which deflects the charged particle beam by use of a main deflector and a sub-deflector disposed along the optical path of the charged particle beam and writes a pattern on a workpiece on a stage, the method comprises writing the pattern with a main deflection settling time determined by a method of determining a main deflection settling time for charged particle beam writing. The method of determining includes a first writing step of writing a pattern in a sub-deflection region after moving the charged particle beam to the sub-deflection region from an adjacent sub-deflection region by main deflection of the charged particle beam and further includes a second writing step of writing a pattern in a sub-deflection region after moving the charged particle beam along a straight line to the sub-deflection region from a diagonally opposite sub-deflection region with respect to the center of the main deflection region by main deflection of the charged particle beam, the straight line resulting from the rotation of one of the two diagonal lines of the main deflection region around the center of the main deflection region. Each of the first and second writing steps includes writing a plurality of the patterns each with a different main deflection settling time. The method of determining further includes: measuring the position of each of the pluralities of patterns written by the first and second writing steps; determining the amount of displacement of each of the pluralities of patterns from its designed position; and determining, in accordance with the amount of main deflection, the main deflection settling time to be used so that the amount of displacement of each pattern written by the first writing step is within a first range and so that the amount of displacement of each pattern written by the second writing step is within a second range.

According to other aspect of the present invention, a charged particle beam writing apparatus which deflects a charged particle beam by use of a main deflector and a sub-deflector disposed along the optical path of the charged particle beam, the charged particle beam writing apparatus comprises: a main deflection amount calculating unit configured to calculate the amount of deflection to be caused by the main deflector; a main deflection settling time determining unit configured to determine a main deflection settling time in accordance with the amount of deflection calculated by the main deflection amount calculating unit; and a deflector control unit configured to control the main deflector based on the main deflection settling time.

DETAILED DESCRIPTION OF THE EMBODIMENTS

An embodiment of the present invention will be described in detail.

Figure 1:
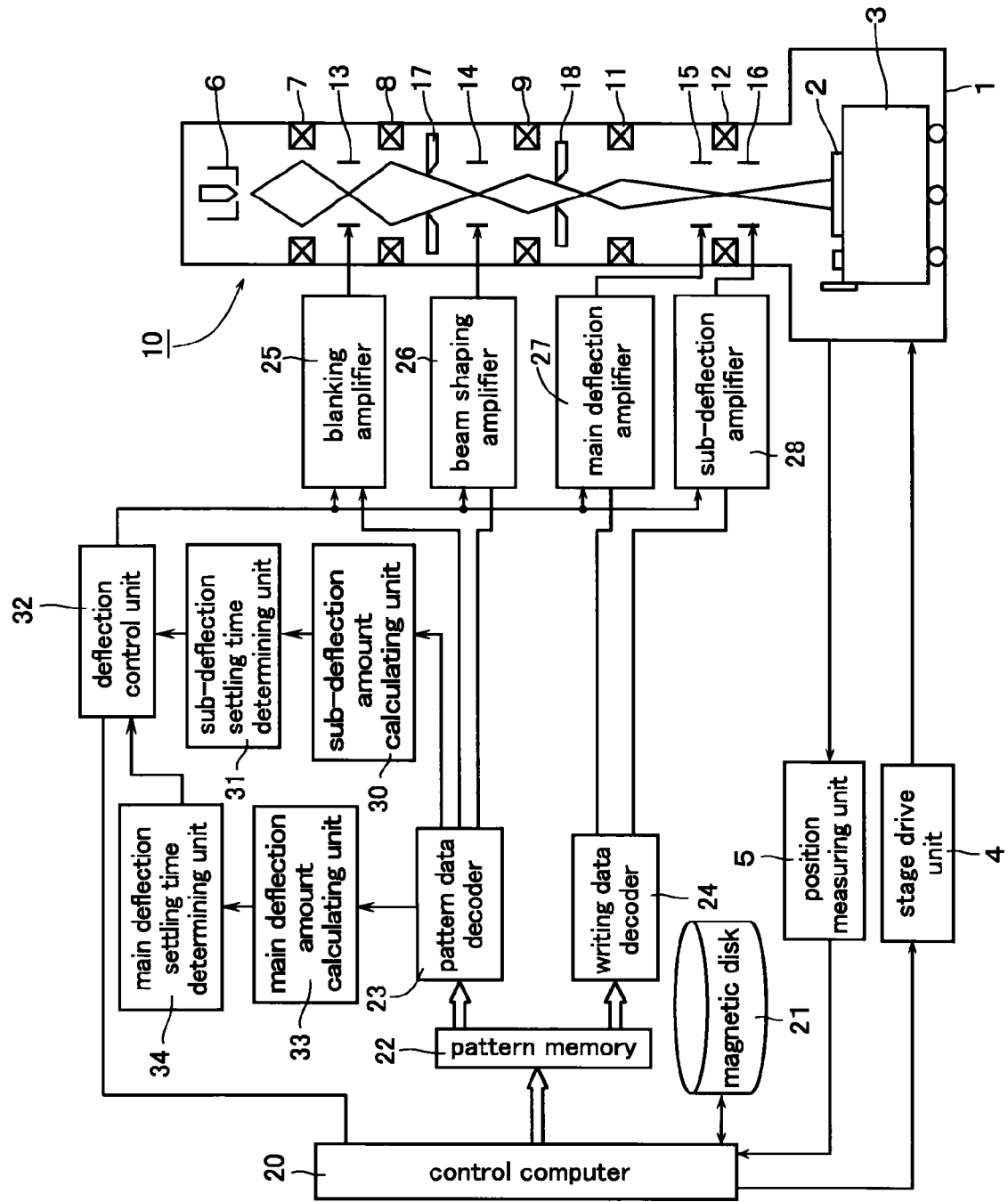
FIG. 1 is a schematic diagram showing the configuration of an electron beam writing apparatus according to the present embodiment.

FIG. 1 is a schematic diagram showing the configuration of an electron beam writing apparatus which is an example of a charged particle beam writing apparatus according to the present embodiment. In this electron beam writing apparatus, a writing chamber 1 houses a stage 3 on which a mask 2 (a workpiece) is mounted. A stage drive unit 4 causes the stage 3 to move in the x direction (i.e., the lateral direction as viewed in FIG. 1) and the y direction (i.e., the direction perpendicular to the plane of the paper). The position of the stage 3 is measured by a position measuring unit 5 using a laser-based measuring device, etc.

An electron beam optical system 10 is disposed above the writing chamber 1. The electron beam optical system 10 includes an electron gun 6, various lenses 7, 8, 9, 11, and 12, a blanking deflector 13, a beam shaping deflector 14, a main deflector 15 and a sub-deflector 16 for beam scanning, and two beam shaping apertures 17 and 18. The main deflector 15 positions the electron beam at a predetermined sub-field (or sub-deflection region) in a main deflection region. The sub-deflector 16, on the other hand, positions the electron beam at each pattern in the sub-field. Further, the beam shaping deflector 14 and the beam shaping apertures 17 and 18 serve to control the beam shape. Further, the blanking deflector 13 serves to control the irradiation of the surface of the mask 2 with the electron beam.

Referring still to FIG. 1, a magnetic disk 21 is connected to a control computer 20. The magnetic disk 21 stores LSI pattern writing data. The pattern writing data read from the magnetic disk 21 is temporarily stored in pattern memory 22 on a frame region basis. The pattern data for each frame region stored in the pattern memory 22, that is, frame information which includes pattern writing position data, pattern shape data, etc., is analyzed by a pattern data decoder 23 and a writing data decoder 24, which serve as data analysis units, and then sent to a blanking amplifier 25, a beam shaping amplifier 26, a main deflection amplifier 27, a sub-deflection amplifier 28, a sub-deflection amount calculating unit 30, and a main deflection amount calculating unit 33.

The pattern data decoder 23 receives pattern writing data and when necessary performs inverse processing of pattern shape data for each frame region to produce inverse pattern data. The pattern data decoder 23 then divides pattern shape data, defined as frame data, into pieces of data each representing one of a group of unit pattern shapes that can be formed by the beam shaping apertures 17 and 18 together. The pattern data decoder 23 then generates blanking data based on the resulting data and sends it to the blanking amplifier 25. The pattern data decoder 23 also generates the desired beam size data and sends it to the beam shaping amplifier 26. The beam shaping amplifier 26 then applies a predetermined deflection signal to the beam shaping deflector 14 in the electron beam optical system 10 to adjust the size of the electron beam.

The sub-deflection amount calculating unit 30 calculates the amount of deflection, or distance of travel, of the electron beam to be caused by the sub-deflector (referred to as the "amount of sub-deflection") for each shot in each sub-field region based on the beam shape data produced by the pattern data decoder 23. The calculated amount of sub-deflection is sent to a sub-deflection settling time determining unit 31. The sub-deflection settling time determining unit 31 determines the sub-deflection settling time to be used in accordance with the amount of sub-deflection calculated by the sub-deflection amount calculating unit 30. This determined sub-deflection settling time is sent to a deflection control unit 32, and the deflection control unit 32 sends it to the blanking amplifier 25, the beam shaping amplifier 26, the main deflection amplifier 27, or the sub-deflection amplifier 28, depending on the pattern writing timing.

The electron beam writing apparatus of the present embodiment also includes the main deflection amount calculating unit 33 and a main deflection settling time determining unit 34.

The main deflection amount calculating unit 33 calculates the amount of deflection, or distance of travel, of the electron beam to be caused by the main deflector (referred to as the "amount of main deflection") in each main deflection region based on the beam shape data produced by the pattern data decoder 23. The calculated amount of main deflection is sent to the main deflection settling time determining unit 34. The main deflection settling time determining unit 34 determines, in the manner described later, the main deflection settling time to be used in accordance with the amount of main deflection calculated by the main deflection amount calculating unit 33. This determined main deflection settling time is sent to the deflection control unit 32, and the deflection control unit 32 sends it to the blanking amplifier 25, the beam shaping amplifier 26, the main deflection amplifier 27, or the sub-deflection amplifier 28, depending on the pattern writing timing.

The writing data decoder 24 generates, based on the frame data, data for positioning the electron beam at a sub-field, and sends it to the main deflection amplifier 27. The main deflection amplifier 27 then sends a predetermined signal to the main deflector 15 in the electron beam optical system 10 to deflect the electron beam to the sub-field. This deflection is controlled based on the main deflection settling time determined by the above main deflection settling time determining unit 34.

The writing data decoder 24 also generates a control signal for the sub-deflector to scan the beam, and sends it to the sub-deflection amplifier 28. The sub-deflection amplifier 28 then sends a predetermined sub-deflection signal to the sub-deflector 16 to write on each sub-field.

Referring still to FIG. 1, the sub-deflector 16 is used to accurately control the position of the electron beam at high speed. Therefore, the sub-deflector 16 has only a limited deflection range which is equal to the size of a sub-field on the mask 2. This means that in order to deflect or move the electron beam from one sub-field to another sub-field, it is necessary to resort to the use of the main deflector 15. Thus, the main deflector 15 is used to move the electron beam from one sub-field to another within a frame (or main deflection region). It should be noted that a frame is the largest area over which the electron beam can be deflected or moved by the main deflector 15 at once. Further, during a write operation, since the stage 3 is continuously moved in one direction, the main deflector 15 deflects the electron beam so that the movement of the stage 3 is offset and the write start point in the sub-field can be tracked.

Figure 2:
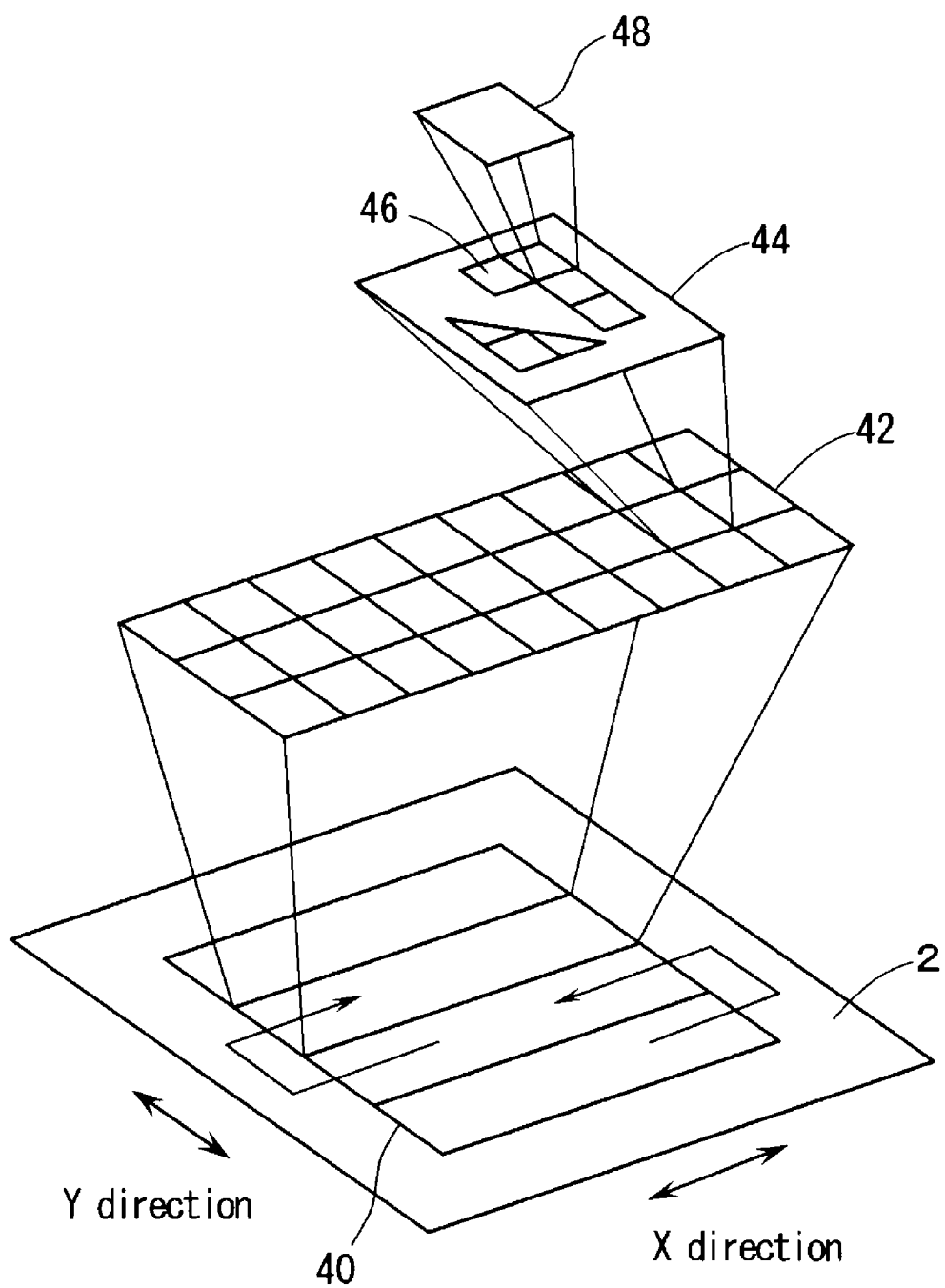
FIG. 2 is a schematic diagram showing a writing operation by an electron beam.

Thus, after being shaped by the beam shaping apertures 17 and 18, the electron beam is deflected by the main deflector 15 and the sub-deflector 16 so that the beam follows the continuously moving stage 3 and is directed to the desired imaging position. FIG. 2 illustrates this operation. In FIG. 2, the reference numeral 40 denotes a writing field; 42, a frame region; 44, a sub-field region; 46, a shot image; and 48, an electron beam. As shown in FIG. 2, first, writing is performed a frame region 42 with the electron beam while the stage (not shown) is moved in x direction. The stage is then moved one step in the y direction, and writing is performed on the next frame region 42. This procedure may be repeated to write on the entire surface of the workpiece. It should be noted that the stage may be continuously moved in the x direction and the electron beam may be caused to follow the moving stage in order to reduce the writing time. On the other hand, the present embodiment may use a step-and-repeat writing method in which writing is performed on each frame with the stage held stationary, and writing is not performed when the electron beam is moved from one frame to another frame.

There will now be described a main deflection settling time determining method used by an electron beam writing method according to the present embodiment.

Figure 3:
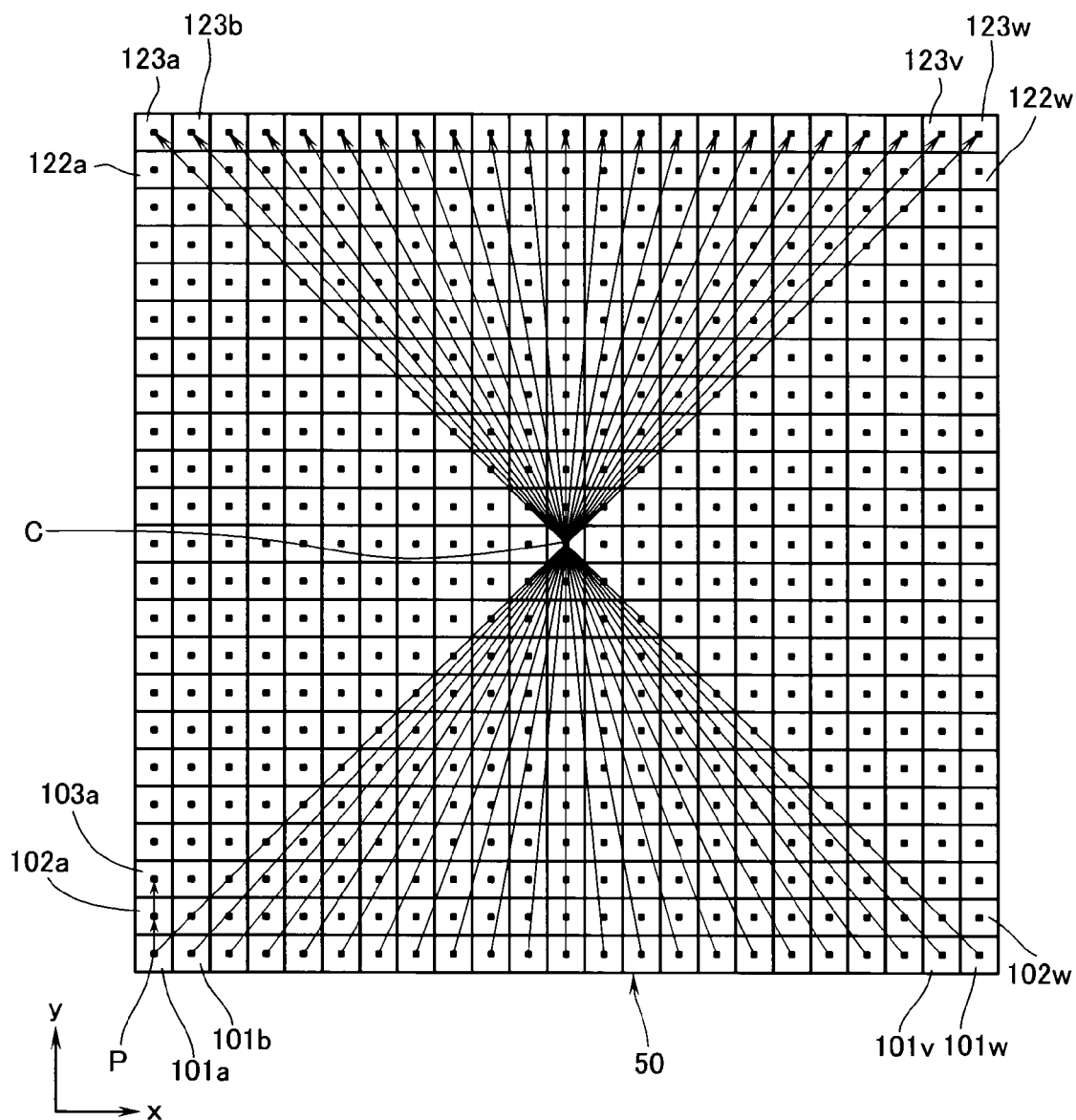
FIG. 3 shows the way in which the electron beam is moved by main deflection of the beam when determining main deflection settling times to be used.

FIG. 3 shows the way in which the electron beam is moved by main deflection of the beam when determining main deflection settling times to be used. Specifically, FIG. 3 shows a main deflection region 50 on which writing is performed with the stage 3 held stationary (i.e., stationary writing). The size of the main deflection region 50 is determined by the deflection width of the main deflector 15 and is, e.g., 184 μm by 184 μm. The main deflection region 50 includes a plurality of sub-deflection regions, e.g., 23 rows by 23 columns of sub-deflection regions, which are denoted by the reference numerals 101a to 101w, . . . , 123a to 123w. The size of each sub-deflection region is determined by the deflection width of the sub-deflector 16 and is, e.g., 8 μm by 8 μm.

According to the present embodiment, each pattern P is written in a sub-deflection region after the electron beam is moved to that sub-deflection region by the main deflector 15 with a different main deflection settling time. It should be noted that the amount of deflection by the sub-deflector 16 may be maintained at a predetermined value so that the electron beam images at the center of each sub-deflection region when the electron beam is positioned at the sub-deflection region by main deflection of the beam. This prevents displacement of each pattern P due to sub-deflection. The position of each written pattern P is then measured by a known position measuring device (not shown) to determine the amount of displacement of the pattern P from its designed position. The main deflection settling time to be used is then determined based on the determined amounts of displacement of the patterns P.

One exemplary way to move the electron beam over the main deflection region by main deflection of the beam is to move it from one adjacent sub-deflection region to another (e.g., from the sub-deflection 101a to the sub-deflection region 102a), which is referred to herein as "short distance movement." It will be noted that in FIG. 3 each arrow indicates the direction of movement of the electron beam.

Figure 4:
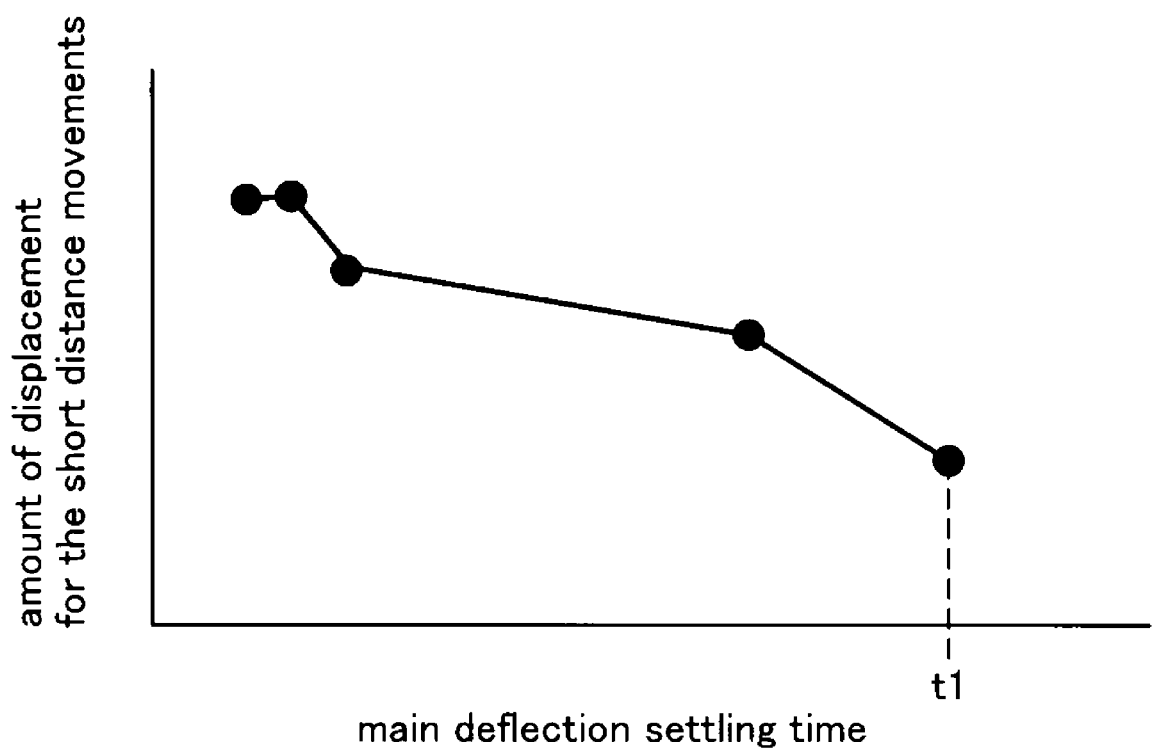
FIG. 4 shows a relationship of a main deflection settling time and an amount of displacement when moving short distance movement to be used.

The main deflection settling time to be used or required for this short distance movement is determined as follows. First, the electron beam is moved from the sub-deflection region 101a to the adjacent sub-deflection region 102a in the y direction by main deflection of the beam with an arbitrary main deflection settling time, and a pattern P is written in the sub-deflection region 102a. Next, the electron beam is moved from the sub-deflection region 102a to the adjacent sub-deflection region 103a in the y direction by main deflection of the beam with the same main deflection settling time, and the same pattern P is written in the sub-deflection region 103a. In this way, the electron beam is moved from one adjacent sub-deflection region to another by main deflection of the beam with the same main deflection settling time to write a pattern P in each sub-deflection region. The position of the pattern P written in each sub-deflection region is then measured by a known position measuring device (not shown) to determine the amount of displacement of the pattern P from its designed position. The determined amounts of displacement of these patterns P are then averaged. The same procedure is repeated with different main deflection settling times to determine, for each main deflection settling time, the average amount of displacement of the patterns P written in the sub-deflection regions. The main deflection settling times used may be, e.g., 3, 5, 10, 15, 20, 25, 35, and 50 μsec. FIG. 4 plots the average amount of displacement of the patterns for different main deflection settling times. From this relationship, the main deflection settling time t1 at which the average amount of displacement is within a predetermined range (e.g., at the minimum) may be determined as the main deflection settling time to be used for the short distance movement described above. This predetermined range may be determined by the throughput requirements.

Another way to move the electron beam over the main deflection by main deflection of the beam is to move it directly from one distant sub-deflection region to another, which is referred to herein as "long distance movement." The main deflection settling time to be used or required for this long distance movement may be determined as follows. For example, by main deflection of the electron beam, the electron beam may be moved along a straight line from one sub-deflection region to the diagonally opposite sub-deflection region with respect to the center C of the main deflection region 50, where the straight line results from the rotation of one of the two diagonal lines of the main deflection region 50 around the center C of the main deflection region 50.

Specifically, first, the electron beam is moved from the sub-deflection region 101a to the diagonally opposite sub-deflection region 123w on the main deflection region by main deflection of the beam with an arbitrary main deflection settling time, and a pattern P is written in the sub-deflection region 123w. The next diagonal movement of the electron beam is started from the sub-deflection region 101b. Specifically, the electron beam is moved from the sub-deflection region 101b to the diagonally opposite sub-deflection region 123v by main deflection of the beam with the same main deflection settling time, and the same pattern P is written in the sub-deflection region 123v. Thus, each time a long distance movement (i.e., a diagonal movement) of the electron beam across the main deflection region is made, the starting point is shifted by one sub-deflection region in the x direction (which can be easily accomplished), with the result that the electron beam travels a different distance each time the movement is made. The position of the pattern P written in each sub-deflection region 123a to 123w after the electron beam is moved a long distance in this way is then measured by a known position measuring device (not shown) to determine the amount of displacement of the pattern P from its designed position. Thus, this method measures the amounts of displacement of the patterns P written in the sub-deflection regions 123a to 123w in a single row. It should be noted that the distances of travel of the electron beam to these sub-deflection regions differ from one another, meaning that in this way it is possible to easily determine the amounts of displacement of a plurality of patterns P written after the electron beam is moved different distances by main deflection of the beam.

Figure 5:
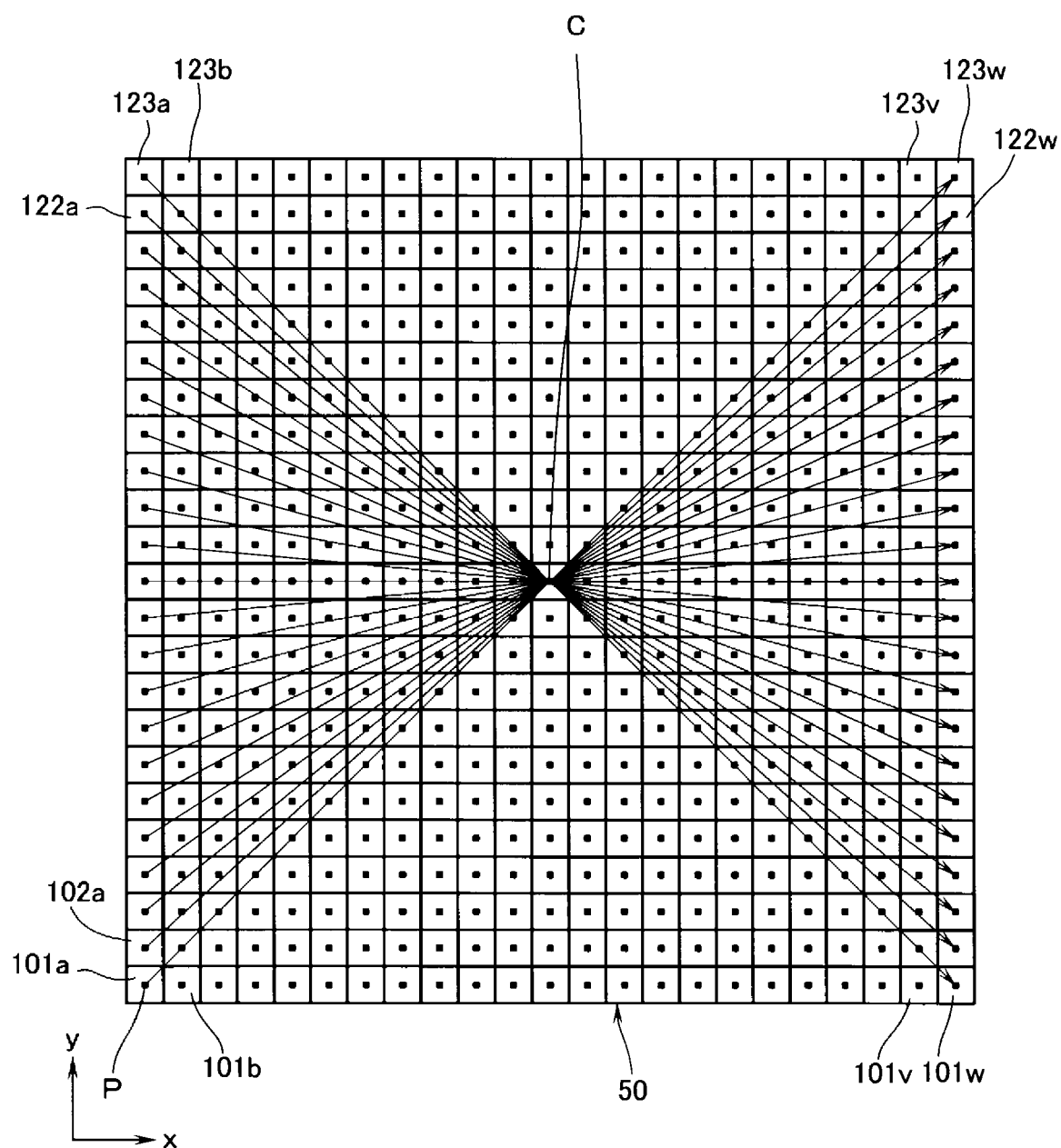
FIG. 5 shows the way in which the electron beam is moved by main deflection of the beam when determining main deflection settling times to be used.

It should be noted that each time a long distance movement of the electron beam is made, the starting point may be shifted in the y direction, as shown in FIG. 5, instead of in the x direction as shown in FIG. 3. The first step of this method also moves the electron beam from the sub-deflection region 101a to the sub-deflection region 123w by main deflection of the beam, and writes a pattern P in the sub-deflection region 123w. The next diagonal movement of the electron beam, however, is started from the sub-deflection region 102a. Specifically, the electron beam is moved from the sub-deflection region 102a to the sub-deflection region 122w by main deflection of the beam. Thus, each time a long distance movement (i.e., a diagonal movement) of the electron beam is made, the starting point is shifted by one sub-deflection region in the y direction (which can be easily accomplished). This also allows the electron beam to travel a different distance each time a long distance movement of the beam is made. The position of the pattern P written in each sub-deflection region 101w to 123w after the electron beam is moved a long distance in this way is then measured by a known position measuring device (not shown) to determine the amount of displacement of the pattern P from its designed position.

Figures 6, 7:
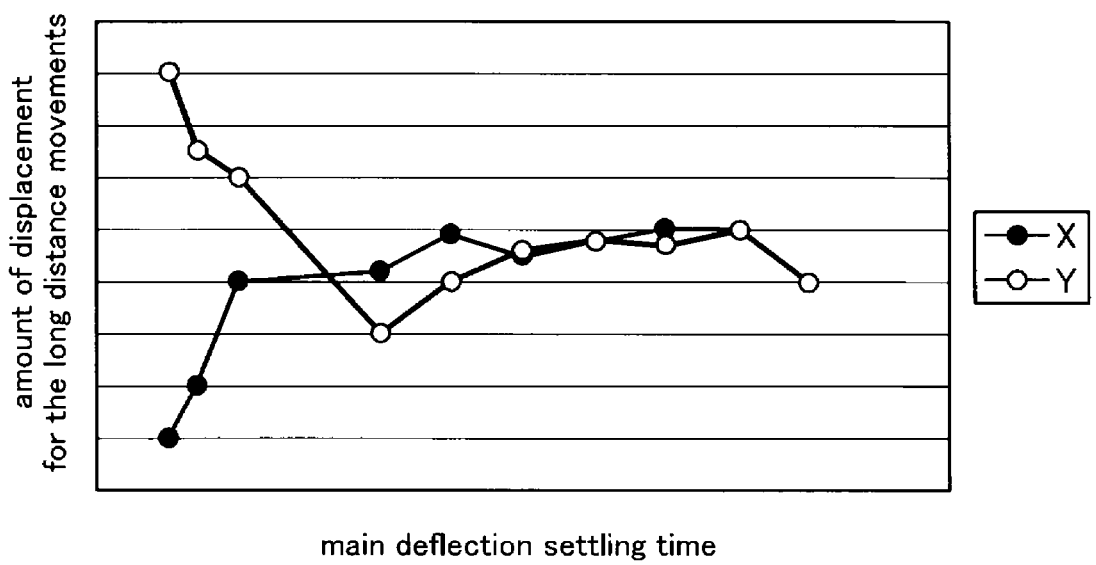
FIG. 6 shows a relationship of a main deflection settling time and an amount of displacement when moving long distance movement to be used.
FIG. 7 is a diagram showing the amount of displacement of the patterns P as a function of the distance of travel of the electron beam caused by main deflection of the beam.

Thus, this method determines the amount of displacement of the pattern P written in each of the sub-deflection regions 101w to 123w and/or 123a to 123w after the electron beam is moved a long distance to the region in the manner described above. This procedure is repeated with different main deflection settling times. FIG. 6 shows, as a function of the main deflection settling time, the amount of displacement of the patterns written after the electron beam is moved a long distance in each of the two ways described above. Specifically, in FIG. 6, the symbol ● indicates, as a function of the main deflection settling time, the amount of displacement of the patterns P written after the electron beam is moved a long distance in the manner described above where each time a long distance movement (or diagonal movement) of the beam is made, its starting point is shifted by one sub-deflection region in the x direction, as shown in FIG. 3. The symbol ○ indicates, as a function of the main deflection settling time, the amount of displacement of the patterns P after the electron beam is moved a long distance in the manner described above where each time a long distance movement of the beam is made, its starting point is shifted by one sub-deflection region in the y direction, as shown in FIG. 5.

FIG. 7 is a diagram showing the amount of displacement of the patterns P as a function of the distance of travel of the electron beam caused by main deflection of the beam with a fixed main deflection settling time. The amounts of displacement of patterns written after short, middle, and long distance movements of the electron beam were experimentally determined and plotted in FIG. 7. This allows one to accurately determine the main deflection settling time to be used. In FIG. 7, interpolation may be used to determine the amounts of displacement of patterns at travel distances between those plotted, i.e., the amounts of displacement of patterns written after different distance movements of the electron beam than those in the experiment. Further, since the amounts of displacement of patterns for the middle distance movements of the beam can be determined from an interpolation of the amounts of displacement of patterns for the short and long distance movements, only the amounts of displacement of patterns for the short and long distance movements need be experimentally determined.

As shown in FIG. 7, there is an approximately linear relationship between the distance of travel and the amount of displacement for the short and middle distance movements but not for long distance movements. In the case of long distance movements, there is no linear relationship between the distance of travel and the amount of displacement, making it difficult to optimize the main deflection settling time for long distance movements. To address this problem, in accordance with the present embodiment, the main deflection settling time for long distance movements is determined so that the amount of displacement of each written pattern P is equal and is minimized. That is, the main deflection settling time is so set as to equalize and minimize the amounts of displacement of the patterns P written after the electron beam is moved a long distance as in the examples shown in FIGS. 3 and 5 in which each time a long distance movement of the beam is made, its starting point is shifted by one-sub-deflection region in the x direction and in the y direction, respectively. This main deflection settling time is regarded as the optimum main deflection settling time. It should be noted that the phrase "equalize the amounts of displacement" does not necessarily mean that the amounts of displacement are exactly equalized, but it means that they are all within a predetermined range. In this way the optimum main deflection settling time for long distance movements can be determined. It should be noted that the above predetermined range may be determined by the throughput requirements.

Incidentally, there has been a trend toward smaller maximum shot sizes in order to improve the positional accuracy of writing. An exemplary maximum shot size may be 0.5 μm by 0.5 μm. A decrease in the maximum shot size may result in the patterns P having round corners, not square corners. This may cause an error in the measurement of the position of the patterns P by a position measuring device.

Figure 8:
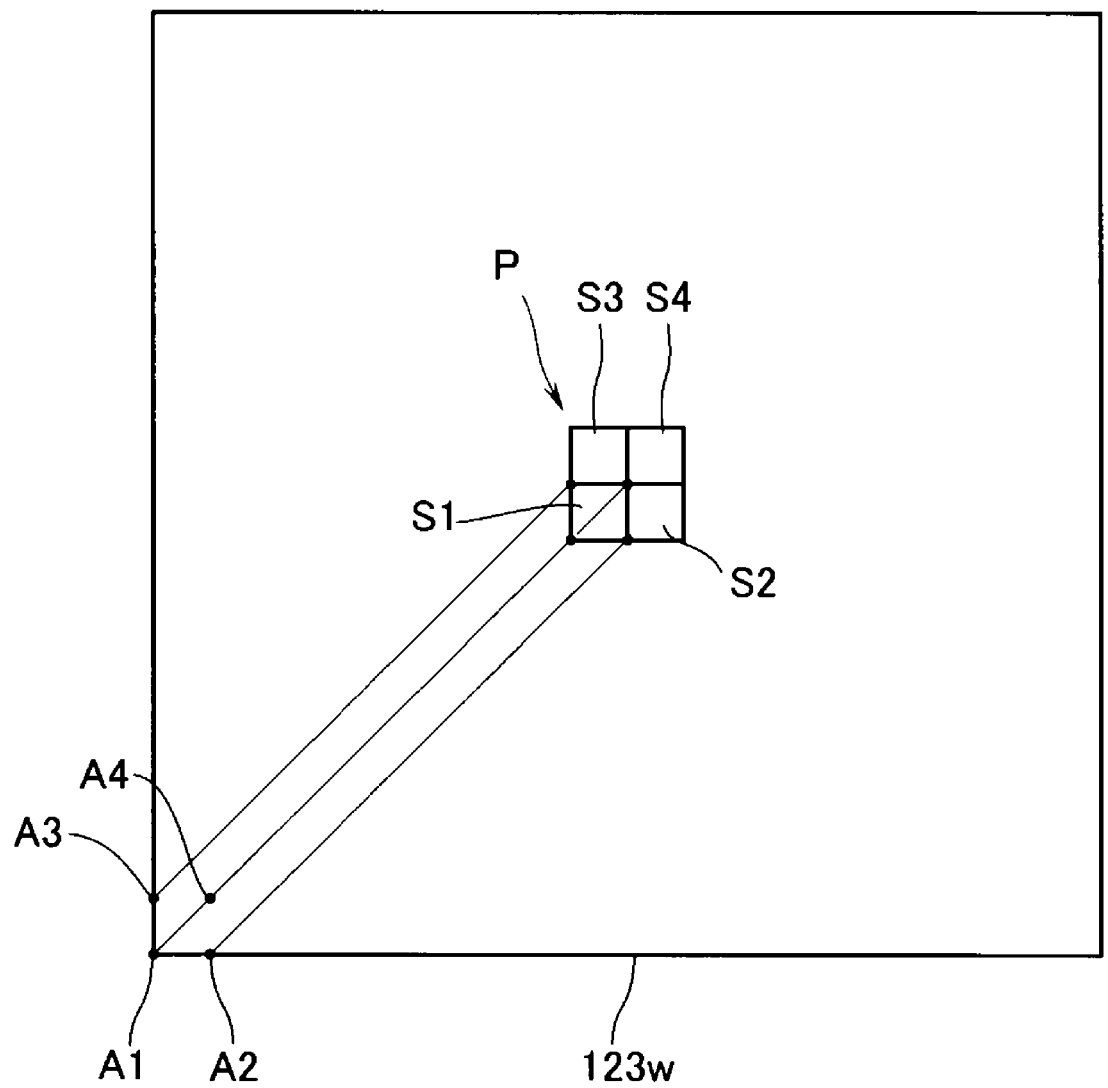
FIG. 8 shows a pattern P made up of a plurality of shot images S1 to S4.

To address this problem, in accordance with the present embodiment, the pattern P written in the sub-deflection region 123w, for example, is made up of a plurality of overlapping shot images S1 to S4 in contact with one another, as shown in FIG. 8. The use of a plurality of shot images (such as S1 to S4) to form the pattern P (whose position is to be measured) in this manner allows an increase in the size of the pattern, resulting in reduced error in the measurement by the position measuring device.

Now let it be assumed that the shot image S1 is written in its place after moving the electron beam to the place by main deflection of the beam and then the other shot images S2 to S4 are written in their places after moving the electron beam to these places by sub-deflection of the beam. In this case, the sub-deflection affects the amount of displacement of the written pattern P. To avoid this, in accordance with the present embodiment, the shot images S1 to S4 are written in their places after the electron beam is moved to these places by main deflection of the beam different amounts specified in main deflection data prepared beforehand, thereby avoiding the use of sub-deflection, which affects the amount of displacement of the written pattern P. Specifically, after writing the shot image S1 in each sub-deflection region, the shot images S2, S3, and S4 are successively written in the region. It should be noted that the shot images S1 to S4 may be written in their places after the electron beam is moved to these places by main deflection of the beam the same amount but from different starting points, such as A1 to A4 shown in FIG. 8, specified in main deflection data prepared beforehand. Thus, when writing each of the plurality of shot images S1 to S4 forming the pattern P, the same amount of main deflection is applied to the electron beam so that the electron beam travels the same distance. This allows one to accurately determine the optimum main deflection settling time.

As described above, in accordance with the present embodiment, the main deflection settling time is optimized with respect to the amount of main deflection applied. Therefore, the writing method of the present embodiment can provide higher throughput than conventional methods in which the main deflection settling time is not optimized although it is long enough to ensure proper writing.

It will be understood that the present invention is not limited to the embodiment described above since various alterations may be made thereto without departing from the spirit and scope of the invention. For example, although the present embodiment uses an electron beam, it is to be understood that the present invention is not limited to electron beams, but may be applied to other charged particle beams such as ion beams.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-118467, filed on May 15, 2009 including specification, claims, drawings and summary, on which the Convention priority of the present application is based, are incorporated herein by reference in its entirety.

What is claimed is:

1. A method of determining a main deflection settling time for a charged particle beam writing apparatus, comprising:
    writing a pattern using a first deflection settling time in each of a plurality of sub-deflection regions by moving the charged particle beam to the sub-deflection region to be written, from an adjacent sub-deflection region;
    writing a pattern using a second deflection settling time in each of a plurality of sub-deflection regions by moving the charged particle beam to the sub-deflection region to be written, from an adjacent sub-deflection region;
    measuring positions of the patterns written by using the first deflection settling time by a position measuring unit;
    determining each amount of displacement of the patterns written by using the first deflection settling time from their positions;
    measuring positions of the patterns written by using the second deflection settling time by the position measuring unit;
    determining each amount of displacement of the pattern written by using the second deflection settling time from their positions;
    calculating an average amount of displacement based on the displacements of the first deflection settling time;
    calculating an average amount of displacement based on the displacements of the second deflection settling time; and
    determining the main deflection settling time based on these average amounts of displacement.

2. The method of determining a deflection settling time for a charged particle beam writing apparatus according to claim 1, wherein:
    the determination of the main deflection settling time is within a predetermined range.

3. The method of determining a deflection settling time for a charged particle beam writing apparatus according to claim 1, wherein:
    each of the pluralities of patterns written by using the first and second deflection settling times are formed by a combination of a plurality of shots.

4. The method of determining a deflection settling time for a charged particle beam writing apparatus according to claim 3, wherein:
    the plurality of shots are written with a same amount of main deflection.

5. A method of determining a main deflection settling time for a charged particle beam writing apparatus, comprising:
    writing a pattern using a first deflection settling time, in each of a plurality of sub-deflection regions, wherein the sub-deflection regions are arranged in a matrix, by moving the charged particle beam to the sub-deflection region from a sub-deflection region diagonally opposite the sub-deflection region to be written, along a straight line passing through the center of the matrix;
    writing a pattern using a second deflection settling time, in each of a plurality of sub-deflection regions by moving the charged particle beam to the sub-deflection region from a sub-deflection region diagonally opposite the sub-deflection region to be written, along a straight line passing through the center of the sub-deflection region;
    measuring positions of the patterns written by using the first deflection settling time by a position measuring unit;
    determining each amount of displacement of the patterns written by using the first deflection settling time from their positions;
    measuring positions of the patterns written by using the second deflection settling time by the position measuring unit;
    determining each amount of displacement of the pattern written by using the second deflection settling time from their positions;
    calculating an average amount of displacement based on the displacements of the first deflection settling time;
    calculating an average amount of displacement based on the displacements of the second deflection settling time; and
    determining the main deflection settling time based on these average amounts of displacement.

6. The method of determining a deflection settling time for a charged particle beam writing apparatus according to claim 5, wherein:
    the determination of the main deflection settling time is within a predetermined range.

7. The method of determining a deflection settling time for a charged particle beam writing apparatus according to claim 5, wherein:
    each of the patterns written by using the first and second deflection settling times are formed by a combination of a plurality of shots.

8. The method of determining a deflection settling time for a charged particle beam writing apparatus according to claim 7, wherein:
    the plurality of shots are written with a same amount of main deflection.

* * * * *

UNITED STATES PATENT AND TRADEMARK OFFICE
CERTIFICATE OF CORRECTION

| | | |
|---|---|---|
| PATENT NO. | : 8,247,783 B2 | Page 1 of 1 |
| APPLICATION NO. | : 12/771108 | |
| DATED | : August 21, 2012 | |
| INVENTOR(S) | : Rieko Nishimura | |

It is certified that error appears in the above-identified patent and that said Letters Patent is hereby corrected as shown below:

On the title page, Item (75), should read:

-- (75) Inventor: Rieko Nishimura, Kanagawa (JP) --

Signed and Sealed this
Sixteenth Day of October, 2012

David J. Kappos
*Director of the United States Patent and Trademark Office*